United States Patent [19]

Yang Lee

[11] Patent Number: 5,061,200
[45] Date of Patent: Oct. 29, 1991

[54] STRESS-DISPERSED CONTACT ELEMENT OF LOW INSERTION FORCE ELECTRICAL CONNECTOR

[76] Inventor: Su-Lan Yang Lee, 4th Floor, No. 506-2, Yuan-San Road, Chung-Ho City, Taipei Hsien, Taiwan

[21] Appl. No.: 677,561
[22] Filed: Mar. 29, 1991
[51] Int. Cl.$^5$ .......................................... H01R 13/00
[52] U.S. Cl. ................................................ 439/326
[58] Field of Search ............... 439/296, 326, 856, 857, 439/861, 862

[56] References Cited

U.S. PATENT DOCUMENTS

| | | | |
|---|---|---|---|
| 3,848,952 | 11/1974 | Tighe, Jr. ........................... | 439/326 |
| 4,136,917 | 1/1979 | Then et al. . | |
| 4,575,172 | 3/1986 | Wales et al. . | |
| 4,713,013 | 12/1987 | Regnier et al. ..................... | 439/326 |
| 4,957,448 | 9/1990 | Stanevich et al. .................. | 439/326 |

Primary Examiner—Joseph H. McGlynn
Attorney, Agent, or Firm—Bacon & Thomas

[57] ABSTRACT

A contact element used in a low insertion force electrical connector for connecting a daughter printed circuit board on a mother board includes a U-shaped base secured in a connector housing slot. A bow-shaped clamping portion suspendedly disposed in the U-shaped base for clamping the daughter printed circuit board. A winding resilient connecting portion integrally connected between one end of the U-shaped base and the bow-shaped clamping portion. A supporting portion integrally formed at the U-shaped base and disposed under the bow-shaped clamping portion for supporting thereunder.

1 Claim, 3 Drawing Sheets

STRESS-DISPERSED CONTACT ELEMENT OF LOW INSERTION FORCE ELECTRICAL CONNECTOR

FIELD OF THE INVENTION

The present invention relates to electrical connectors, and more particularly to a low insertion force electrical connector. The present invention is to provide an improvement of the metallic contact element.

DESCRIPTION OF THE PRIOR ART

An electrical connector is specifically provided to clamp two or more printed circuit boards and form an electrical connection between/among them. Of which a low insertion force electrical connector can make printed circuit boards be easily inserted the contact portion of electrical connector with only rather low insertion force has been widely applied to the cycle of industry.

Existing low insertion force electrical connectors are disclosed in such as the U.S. Pat. No. 4,136,917 which is comparatively typical. In said U.S. Patent it tends to result in elastic fatigue or plastic deformation due to in failure of to effectively disperse the stress because the spring legs 12 and 13 of a plurality of metallic contact elements cannot move jointly each other and further because the spring legs 12 and 13 are too short.

Walse et al. disclosed a low insertion force electrical connector in their U.S. Pat. No. 4,575,172 by inserting a printed circuit board into a C-shaped portion 70 with two opposed arcuate beam members 72, 74 for clamping the printed circuit board. The C-shaped portion 70 is pivotably mounted on the leg 76. Upon an insertion of the board 12, the leg 76 will be subjected to an internal stress acting thereon causing permanent set of the contact elements and poor electrical connection since the leg 76 can not effectively disperse the stress.

In view of above-mentioned drawback, the present invention is to provide an improvement for electrical connector, and more particularly to provide an improvement of the metallic contact element, which is effectively to disperse the stress as well as to make each contact portion apply rather uniformous contact pressure against printed circuit boards.

SUMMARY OF THE INVENTION

The object of the present invention is to provide a contact element used in a low insertion force electrical connector comprising an U-shaped base disposed in a slot of an insulating connector housing; a bow-shaped clamping portion suspendedly disposed in the U-shaped base and having two contact portions respectively formed at the two ends thereof; a winding resilient connecting portion having two ends, one end integrally connected to one end of the U-shaped base, and the bow-shaped clamping portion suspendedly disposed in the U-shaped base so that the stress produced from the bow-shaped clamping portion can be dispersed through winding resilient connecting portion in order to prevent plastic deformation and allow the two contact portions to maintain a fixed proportion relationship of clamping force for clamping printed circuit boards respectively., a supporting portion for supporting the bottom portion of the bow-shaped clamping portion to prevent plastic deformation due to overstressing of above-mentioned contact elements.

The foregoing and other object advantages of the present invention will become apparent to those skilled in the art from the following detailed description taken with reference to the accompanying drawings.

DETAILED DESCRIPTION OF THE PREFERRED EMBODIMENT

Figure 1:
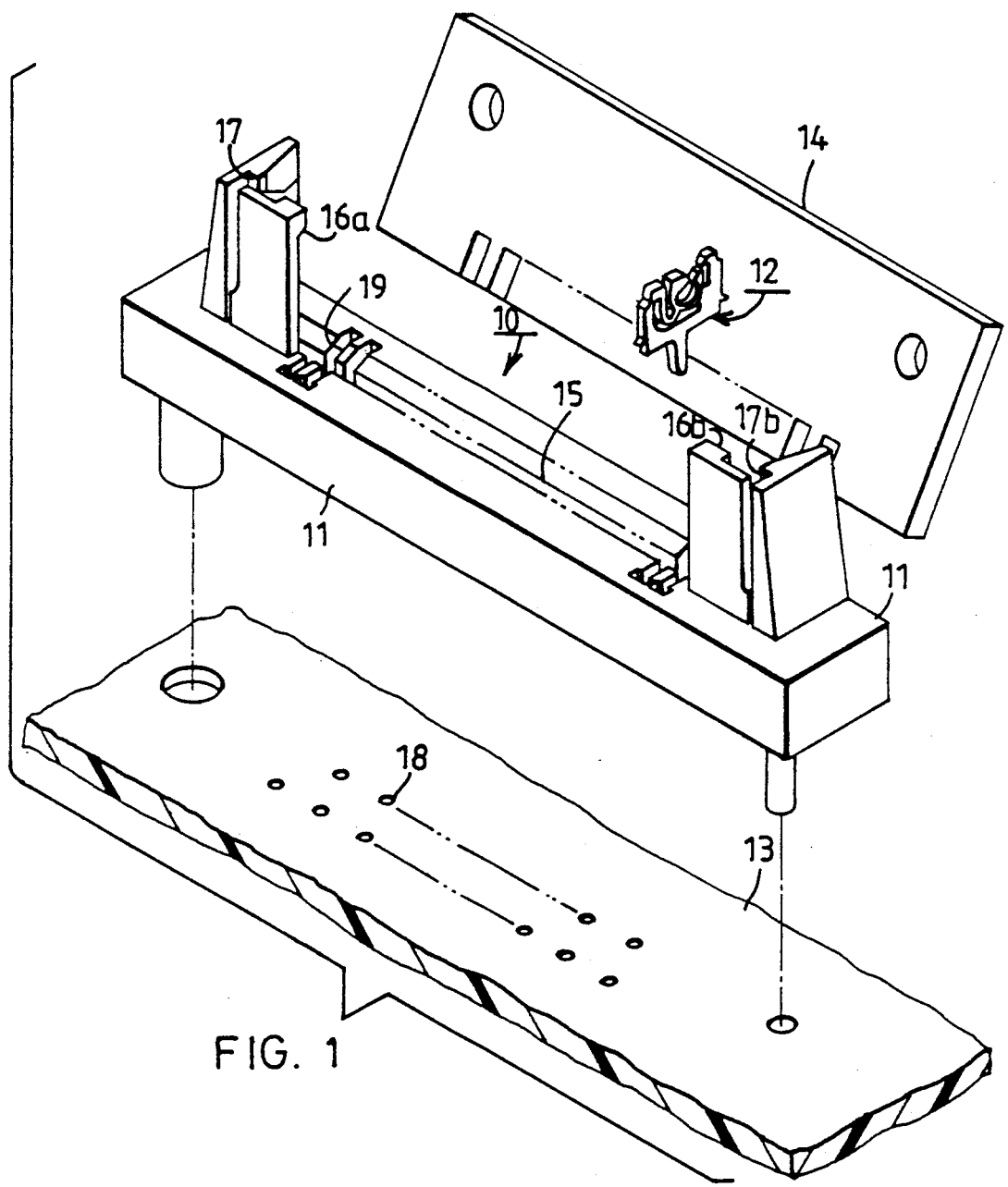
FIG. 1 is an exploded isometric view of a low insertion force electrical connector in accordance with the present invention.

As shown in FIG. 1, an electrical connector 10 comprises an insulating connector housing 11 and a plurality of contact elements 12. The insulating connector housing 11 is secured to a mother board 13, and a daughter printed circuit board 14 inserted in the elongate socket of insulating connector housing 11 and latched through two protrusions 16a and 16b, tow latches 17a and 17b.

Figure 2:
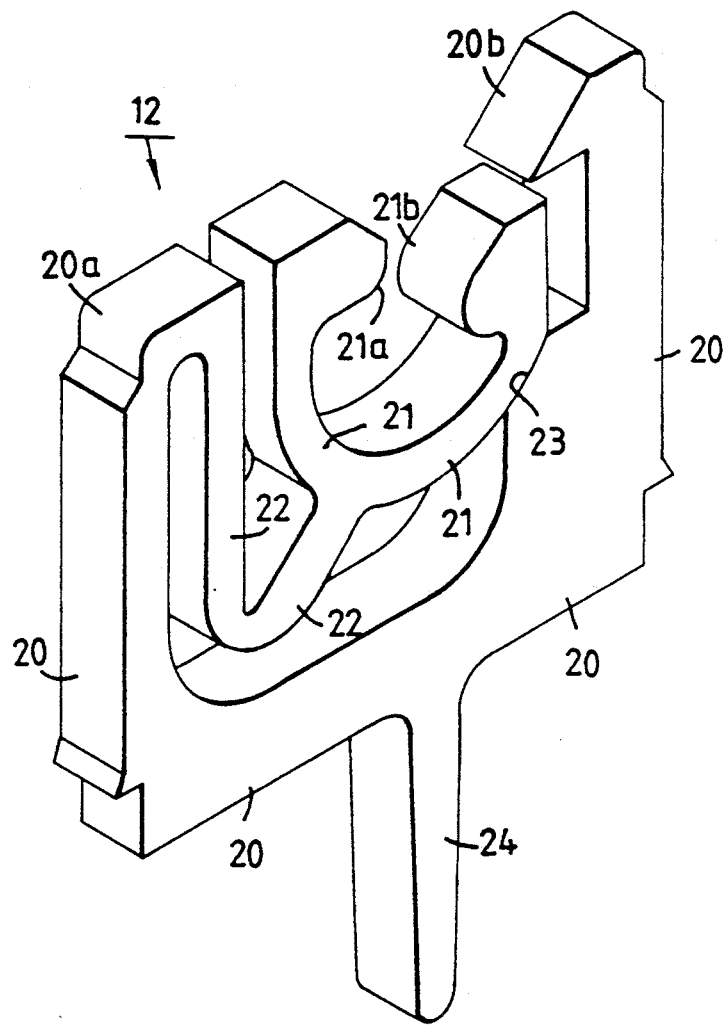
FIG. 2 is an isometric view of a metallic contact element of the low insertion force electrical connector as shown in FIG. 1.

As shown in FIG. 2, the contact element 12 of the present invention is inserted in the slot 19 (as shown in FIG. 1) and said contact element 12 includes: a U-shaped base 20 having two ends 20a and 20b, a bow-shaped clamping portion 21 each end having a contact portion 21a, 21b permitted to clamp respective side of printed circuit board. The bow-shaped clamping portion 21 is connected from its bottom part to the end 20a of U-shaped base 20 through a winding resilient connecting portion 22 whereby the bow-shaped clamping portion 21 is suspendedly disposed in the U-shaped base 20. For preventing the bow-shaped clamping portion 21 from much deformation, a supporting portion 23 is formed extending from the U-shaped base 20 to allow the bow-shaped clamping portion 21 to be laid onto the supporting portion 23. The leg portion 24 formed extending downwardly from the middle part of the U-shaped base 20 is permitted to be inserted in the hole 18 of mother board 13 (as shown in FIGS. 1 and 3).

Figure 3:
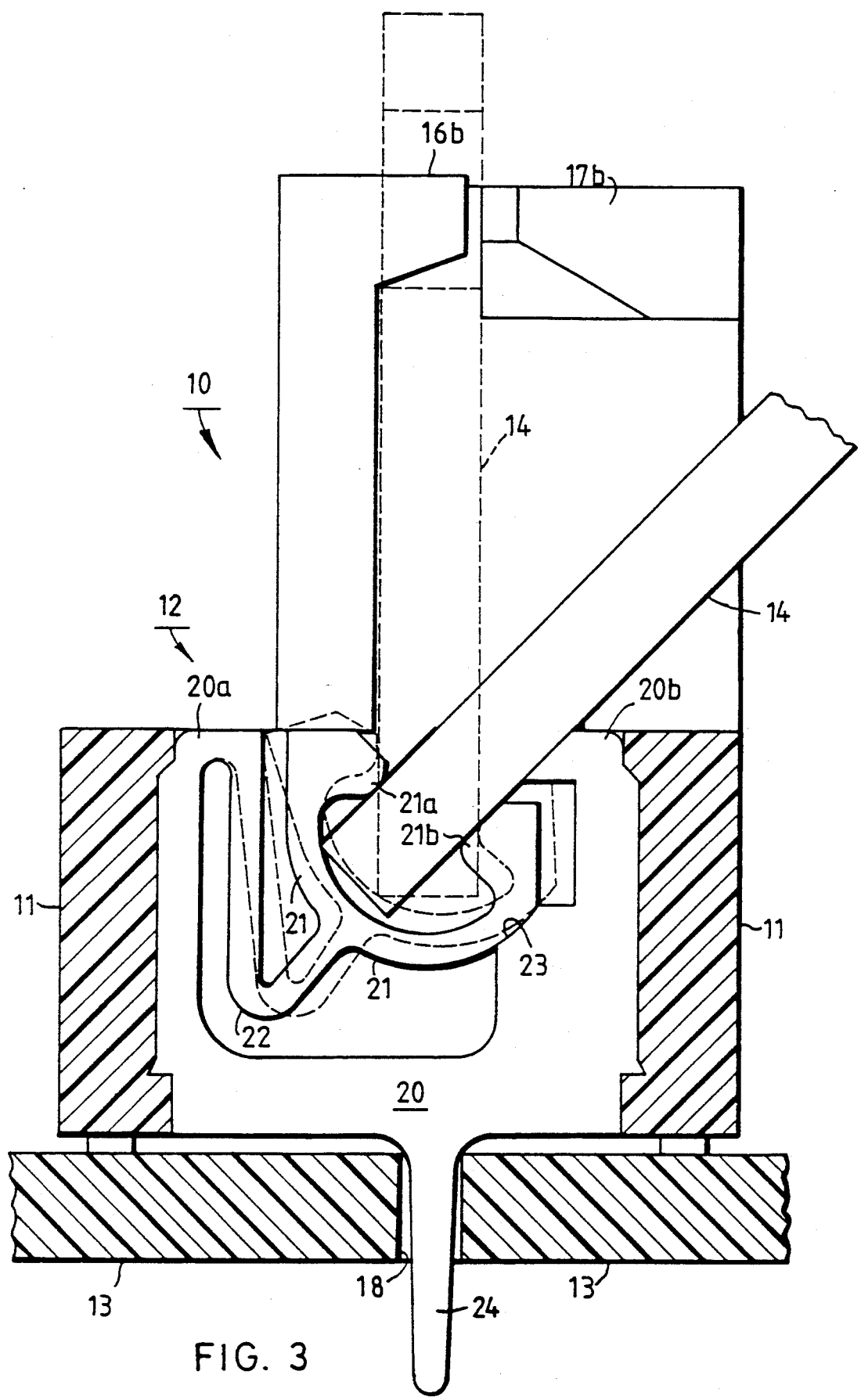
FIG. 3 is a cross sec tonal view of the low insertion force electrical connector in accordance with the present invention.

As shown in FIG. 3, the daughter board 14 is inserted between the two contact portions 21a and 21b. The full line shows it is not turned to the right position yet and dotted line shows that it is turned to the right position already. The condition of change in the bow-shaped clamping portion 21 and resilient connecting portion 22 can be compared clearly.

Referring to above-said description, the bow-shaped clamping portion 21 of contact element of electrical connector of the present invention can be suspendedly disposed in the U-shaped base 20 through the winding resilient connecting portion 22 so that the pressure applied respectively by the two contact portions 21a and 22b to the daughter board 14 is comparatively uniformous to obtain better contact effect. And it is effectively to prevent plastic deformation since the stress is effectively dispersed to the resilient connecting portion 22 because the bow-shaped clamping portion 21 is connected to the U-shaped base 20 through the resilient connecting portion 22. Further with the supporting portion 23 for holding the bottom part of bow-shaped clamping portion 21 upwardly, it can prevent much deformation caused to the bow-shaped clamping portion 21 due to mishandling when the daughter board 14 is inserted.

What is claimed is:

1. A contact element of a low insertion force electrical connector including connector housing having an elongate socket longitudinally formed in the connector housing, a plurality of slots transversely formed in said elongate socket for receiving a plurality of contact elements therein, a daughter printed circuit board inserted through the socket to be clamped by the plurality of contact elements for connecting the daughter board to a mother board secured to the connector housing, each contact element having a leg portion protruding downwardly to be connected with the mother board, the improvement which comprises:

said contact element including:

an U-shaped base integrally formed on the leg of the contact element and having two ends oppositely disposed at same elevation in the slot;

a bow-shaped clamping portion suspendedly disposed in the U-shaped base and having two contact portions respectively formed at two opposite ends of the bow-shaped clamping portion, said ends being resiliently movable with respect to each other after both said contact portions engage the daughter board;

a winding resilient connecting portion having two ends, one end integrally connected to one end of the U-shaped base, and another end integrally connected to the bow-shaped clamping portion; and a supporting portion integrally formed at the U-shaped base and disposed under the bow-shaped clamping portion for supporting thereunder.

* * * * *